United States Patent
Jia (10) Patent No.: US 12,402,471 B2
(45) Date of Patent: Aug. 26, 2025

(54) ORGANIC LIGHT EMITTING DEVICE, DISPLAY SUBSTRATE AND DISPLAY APPARATUS

(71) Applicants: Hefei BOE Joint Technology Co., Ltd., Anhui (CN); BOE Technology Group Co., Ltd., Beijing (CN)

(72) Inventor: Wenbin Jia, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 151 days.

(21) Appl. No.: 17/802,156

(22) PCT Filed: Nov. 8, 2021

(86) PCT No.: PCT/CN2021/129208
§ 371 (c)(1),
(2) Date: Aug. 25, 2022

(87) PCT Pub. No.: WO2022/205918
PCT Pub. Date: Oct. 6, 2022

(65) Prior Publication Data
US 2024/0206218 A1 Jun. 20, 2024

(30) Foreign Application Priority Data
Mar. 31, 2021 (CN) .......................... 202110349562.7

(51) Int. Cl.
*H10K 50/155* (2023.01)
*H10K 50/15* (2023.01)
(Continued)

(52) U.S. Cl.
CPC ......... *H10K 50/155* (2023.02); *H10K 50/156* (2023.02); *H10K 50/165* (2023.02);
(Continued)

(58) Field of Classification Search
None
See application file for complete search history.

(56) References Cited

U.S. PATENT DOCUMENTS

2004/0227460 A1* 11/2004 Liao ....................... H10K 50/19
313/506
2007/0114527 A1 5/2007 Kumaki et al.
(Continued)

FOREIGN PATENT DOCUMENTS

| CN | 1902984 A | 1/2007 |
|---|---|---|
| CN | 101027799 A | 8/2007 |

(Continued)

OTHER PUBLICATIONS

International Search Report for PCT/CN2021/129208 Mailed Jan. 28, 2022.
(Continued)

*Primary Examiner* — Khaja Ahmad
(74) *Attorney, Agent, or Firm* — Ling Wu; Stephen Yang; Ling and Yang Intellectual Property (57) ABSTRACT

An organic light emitting device, a display substrate and a display apparatus are provided, wherein the organic light emitting device comprises an anode, an organic light emitting layer, a first transition protective layer and a cathode which are stacked sequentially; the organic light emitting layer comprises a hole injection layer, a light emitting material layer, an electron transport layer and an electron injection layer; and a first transition protective layer is disposed between the electron injection layer and the cathode, and forms a PN junction with the electron injection layer.

16 Claims, 6 Drawing Sheets

(51) Int. Cl.
  *H10K 50/16* (2023.01)
  *H10K 50/165* (2023.01)
  *H10K 50/17* (2023.01)
  *H10K 50/18* (2023.01)
  *H10K 50/19* (2023.01)
  *H10K 50/828* (2023.01)
  *H10K 59/35* (2023.01)
  *H10K 102/00* (2023.01)

(52) U.S. Cl.
  CPC ........... *H10K 50/166* (2023.02); *H10K 50/17* (2023.02); *H10K 50/171* (2023.02); *H10K 50/181* (2023.02); *H10K 50/19* (2023.02); *H10K 50/828* (2023.02); *H10K 59/351* (2023.02); *H10K 2102/3026* (2023.02); *H10K 2102/351* (2023.02)

(56) References Cited

U.S. PATENT DOCUMENTS

| 2007/0114544 | A1 | 5/2007 | Kumaki et al. | |
|---|---|---|---|---|
| 2008/0224602 | A1* | 9/2008 | Choi | H10K 50/125 |
| | | | | 313/504 |
| 2011/0079774 | A1* | 4/2011 | Kang | C09K 11/06 |
| | | | | 257/40 |
| 2014/0077198 | A1 | 3/2014 | Kashiwabara | |
| 2015/0115244 | A1 | 4/2015 | Joo et al. | |
| 2015/0144895 | A1 | 5/2015 | Joo et al. | |
| 2015/0144896 | A1 | 5/2015 | Joo et al. | |
| 2018/0233688 | A1* | 8/2018 | Chen | H10K 50/00 |
| 2020/0303651 | A1* | 9/2020 | Kim | C07D 213/61 |

FOREIGN PATENT DOCUMENTS

| CN | 103730579 A | 4/2014 |
|---|---|---|
| CN | 104051653 A | 9/2014 |
| CN | 104321896 A | 1/2015 |
| CN | 104335378 A | 2/2015 |
| CN | 104335379 A | 2/2015 |
| CN | 113097399 A | 7/2021 |

OTHER PUBLICATIONS

Office Action dated Jan. 27, 2022 for Chinese Patent Application No. 202110349562.7 and English Translation.

* cited by examiner

ORGANIC LIGHT EMITTING DEVICE, DISPLAY SUBSTRATE AND DISPLAY APPARATUS

CROSS-REFERENCE TO RELATED APPLICATIONS

This application is a national stage application of PCT Application No. PCT/CN2021/129208, which is filed on Nov. 8, 2021 and claims the priority of Chinese Patent Application No. 202110349562.7, filed to the CNIPA on Mar. 31, 2021 and entitled "Organic Light Emitting Device, Display Substrate and Display Apparatus", the content of which should be regarded as being incorporated herein by reference.

TECHNICAL FIELD

Embodiments of the disclosure relate, but not limited, to the technical field of display, and in particular to an organic light emitting device, display substrate and a display apparatus.

BACKGROUND

An Organic Light Emitting Diode (OLED for short) is an active light emitting device having advantages such as light emission, ultra-thinness, wide viewing angle, high brightness, high contrast, low power consumption, extremely high response speed, etc., which has gradually become the next generation display technology with great development prospects.

An OLED includes an anode, a cathode, and a light emitting layer disposed between the anode and the cathode. A light emitting principle of the OLED is to inject holes and electrons into the light emitting layer from the anode and the cathode respectively. When the electrons and the holes meet in the light emitting layer, the electrons and the holes recombine to produce excitons. When transforming from an excited state to a ground state, these excitons emit light. In order to inject the electrons and the holes from an electrode into the light emitting layer smoothly under a relatively low driving voltage, a hole injection layer is provided between the anode and the light emitting layer, and an electron injection layer is provided between the cathode and the light emitting layer.

SUMMARY

The following is a summary of subject matters described herein in detail. The summary is not intended to limit the protection scope of claims.

In a first aspect, the present disclosure provides an organic light emitting device including an anode, an organic light emitting layer, a first transition protective layer and a cathode which are stacked sequentially; the organic light emitting layer includes a hole injection layer, a light emitting material layer, an electron transport layer and an electron injection layer.

The first transition protective layer is disposed between the electron injection layer and the cathode, and forms a PN junction with the electron injection layer.

In some possible implementations, a second transition protective layer disposed between the first transition protective layer and the cathode is further included.

The second transition protective layer and the first transition protective layer form a PN junction.

In some possible implementations, the fabrication material of the electron injection layer includes an N-doping organic material, and the doping material of the electron injection layer includes lithium fluoride or a complex of lithium and cesium carbonate.

A fabrication material of the first transition protective layer includes a P-doping organic material, and a doping material of the first transition protective layer includes molybdenum trioxide.

In some possible implementations, the fabrication material of the second transition protective layer includes an N-doping organic material, and the doping material of the second transition protective layer includes lithium fluoride or a complex of lithium and cesium carbonate.

In some possible implementations, the number of electron injection layers is greater than or equal to 1.

In some possible implementations, the organic light emitting layer further includes a hole transport layer, and when the number of the electron injection layers is 1, the hole injection is located between the light emitting material layer and the anode, the hole transport layer is located between the hole injection layer and the light emitting material layer, and the electron transport layer is located between the light emitting material layer and the electron injection layer.

The fabrication material of the hole injection layer includes a P-doping organic material, and the doping material of the hole injection layer includes molybdenum trioxide.

In some possible implementations, the organic light emitting layer further includes a hole transport layer, and when the number of the electron injection layers is 1, the electron injection layer and the electron transport layer are the same film layer; the hole injection layer is located between the light emitting material layer and the anode, and the hole transport layer is located between the hole injection layer and the light emitting material layer; the electron injection layer is located between the light emitting material layer and the first transition protective layer;

The fabrication material of the hole injection layer includes a P-doping organic material, and the doping material of the hole injection layer includes molybdenum trioxide.

In some possible implementations, the organic light emitting layer further includes a hole block layer and an electron block layer;

The hole block layer is located between the light emitting material layer and the electron transport layer, and the electron block layer is located between the light emitting material layer and the hole transport layer.

In some possible implementations, the anode is a transparent electrode and the cathode is a reflective electrode.

In some possible implementations, when the number of the electron injection layers is greater than 1, an ith electron injection layer is located on a side of an (i+1)th electron injection layer close to the anode; $1 \leq I \leq N-1$, N is the number of electron injection layers.

The transition protective layer and the Nth electron injection layer form a PN junction.

In some possible implementations, when N=3, the number of the hole injection layers is three and the number of the light emitting material layers is four.

A first light emitting material layer is located between a first hole injection layer and a first electron injection layer, the first hole injection layer is located on a side of the first light emitting material layer close to the anode, and the first electron injection layer is located on a side of the first light emitting material layer away from the anode.

A second light emitting material layer and a third light emitting material layer are located between a second hole injection layer and a second electron injection layer, the third light emitting material layer is located on a side of the second light emitting material layer away from the anode, the second hole injection layer is located on a side of the second light emitting material layer close to the anode, and the second electron injection layer is located on a side of the third light emitting material layer away from the anode.

A fourth light emitting material layer is located between the third hole injection layer and the third electron injection layer, the third hole injection layer is located on a side of the fourth light emitting material layer close to the anode, and the third electron injection layer is located on a side of the fourth light emitting material layer far away from the anode.

The second hole injection layer is located between the first electron injection layer and the second light emitting material layer, and a third hole injection layer is located between the second electron injection layer and the fourth light emitting material layer; the first transition protective layer is located between the third electron injection layer and the cathode; and the third electron injection layer is multiplexed into an electron transport layer.

In some possible implementations, the fabrication material of the first light emitting material layer is the same as that of the fourth light emitting material layer, and is a blue light emitting material.

The second light emitting material layer is a red light emitting material, and the third light emitting material layer is a yellow light emitting material.

In some possible implementations, the fabrication materials of the three hole injection layers includes P-doping organic materials, and the doping material of the hole injection layer includes molybdenum trioxide.

In some possible implementations, both the anode and the cathode are transparent electrodes.

In a second aspect, the present disclosure further provides a display substrate, including the organic light emitting device described above.

In a third aspect, the present disclosure further provides a display apparatus, including the display substrate described above.

Other aspects may be understood upon reading and understanding the drawings and the detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

DETAILED DESCRIPTION

Implementations herein may be implemented in multiple different forms. Those of ordinary skills in the art can readily appreciate a fact that the implementations and contents may be varied into various forms without departing from the spirit and scope of the present disclosure. Therefore, the present disclosure should not be explained as being limited to contents described in following implementation modes only. The embodiments in the present disclosure and features in the embodiments may be combined randomly with each other without conflict.

In the accompanying drawings, a size of a constituent element, and a thickness of a layer or a region is sometimes exaggerated for clarity. Therefore, any one implementation of the present disclosure is not necessarily limited to dimensions shown in the drawings, and the shapes and sizes of the components in the accompanying drawings do not reflect actual scales. In addition, the accompanying drawings schematically show an ideal example, and any one implementation of the present disclosure is not limited to the shapes, values, or the like shown in the accompanying drawings.

Ordinal numerals such as "first", "second", and "third" herein are set to avoid confusion between constituent elements, but are not intended to limit in terms of quantity.

Herein, for convenience, wordings indicating orientations or positional relationships, such as "center", "upper", "lower", "front", "back", "vertical", "horizontal", "top", "bottom", "inside", "outside", and the like are used to describe the positional relationships between the constituent elements with reference to the accompanying drawings, and are merely for facilitating describing the implementations and simplifying the specification, rather than indicating or implying that the referred apparatuses or elements must have particular orientations, and be constructed and operated in particular orientations. Thus, they cannot be construed as a limitation on the present disclosure. The positional relationships between the constituent elements can be appropriately changed according to directions according to which the constituent elements are described. Therefore, appropriate replacements can be made according to situations without being limited to the wordings described in the specification.

Herein, unless otherwise specified and defined explicitly, terms "mount", "mutually connect", "connect" and the like should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations.

Herein, a transistor refers to an element at least including three terminals, i.e., a gate electrode, a drain electrode, and a source electrode. A transistor has a channel area between a drain electrode (or referred to as a drain electrode terminal, a drain region, or a drain electrode) and a source electrode (or referred to as a source electrode terminal, a source region, or a source electrode), and a current can flow through the drain electrode, the channel area, and the source electrode. Herein, the channel region refers to a region through which the current mainly flows.

Herein, a first electrode may be the drain electrode and a second electrode may be the source electrode; or, the first electrode may be the source electrode and the second electrode may be the drain electrode. Herein, functions of the "source electrode" and the "drain electrode" are sometimes interchangeable with each other in a case that transistors with opposite polarities are used or a current direction changes during circuit operation. Therefore, the "source electrode" and the "drain electrode" are interchangeable herein.

Herein, an "electrical connection" includes a case that constituent elements are connected together through an element with some electrical function. The "element with the certain electrical effect" is not particularly limited as long as electrical signals may be sent and received between the connected constituent elements. For example, "the elements with the certain electrical effect" may be electrodes or wirings, or switch elements, such as transistors, or other functional elements, such as resistors, inductors, capacitors, or the like.

Herein, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

Herein, a "film" and a "layer" are interchangeable. For example, a "conductive layer" may be replaced with a "conductive film" sometimes. Similarly, an "insulating film" may be replaced with an "insulating layer" sometimes.

"About" herein refers to that a boundary is defined not so strictly and numerical values within process and measurement error ranges are allowed.

Figure 1:
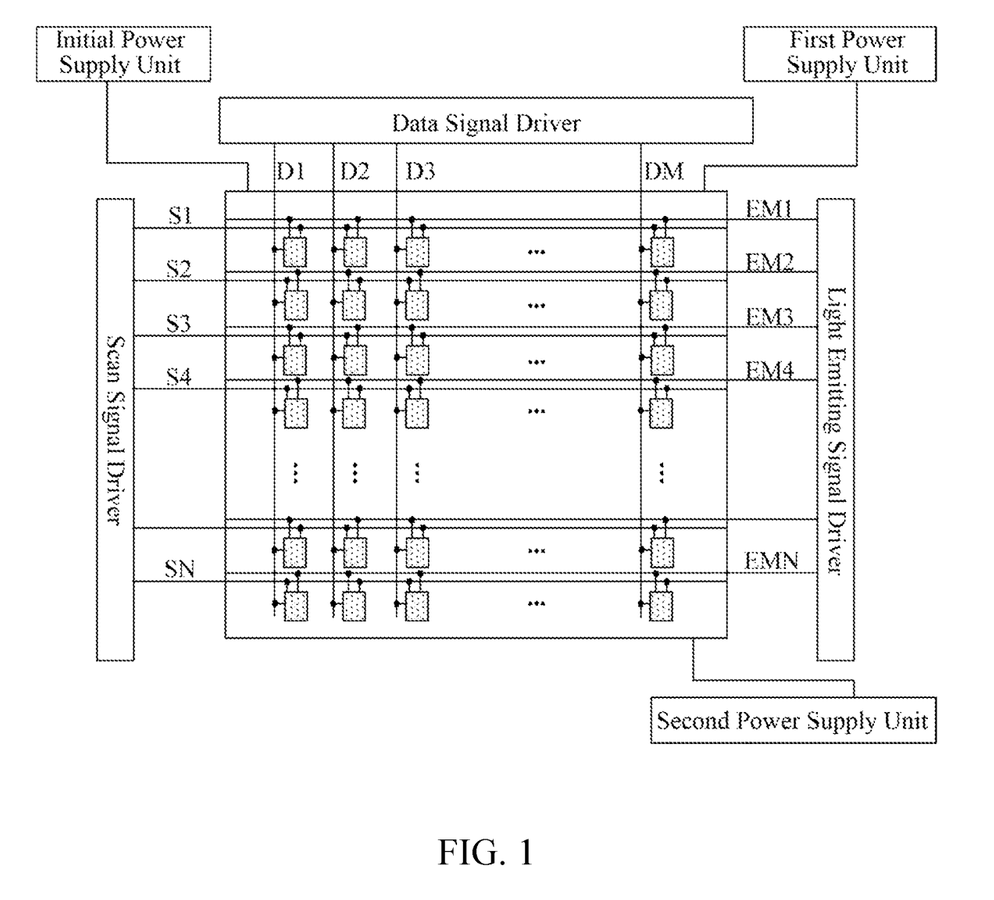
FIG. 1 is a schematic diagram of a structure of an Organic Light Emitting Diode (OLED) display apparatus.

FIG. 1 is a schematic diagram of a structure of an OLED display apparatus. As shown in FIG. 1, the OLED display apparatus may include a scanning signal driver, a data signal driver, a light-emitting signal driver, an OLED display substrate, a first power supply unit, a second power supply unit and an initial power supply unit.

In an exemplary embodiment, the OLED display substrate at least includes a plurality of scan signal lines (S1 to SN), a plurality of data signal lines (D1 to DM) and a plurality of light emitting signal lines (EM1 to EMN). The scan signal driver is configured to sequentially provide scan signals to the plurality of scan signal lines (S1 to SN), the data signal driver is configured to provide data signals to the plurality of data signal lines (D1 to DM), and the light emitting signal driver is configured to sequentially provide light emitting control signals to the plurality of light emitting signal lines (EM1 to EMN).

In an exemplary embodiment, the plurality of scan signal lines and the plurality of light emitting signal lines extend along a horizontal direction, and a plurality of data signal lines extend in a vertical direction. The OLED display apparatus includes a plurality of sub-pixels, and one sub-pixel is connected with a scanning signal line, a light-emitting control line and a data signal line, for example. The first power supply unit, the second power supply unit, and the initial power supply unit are configured to provide a first power supply voltage, a second power supply voltage, and an initial power supply voltage to a pixel circuit through a first power supply line, a second power supply line, and an initial signal line respectively.

Figure 2:
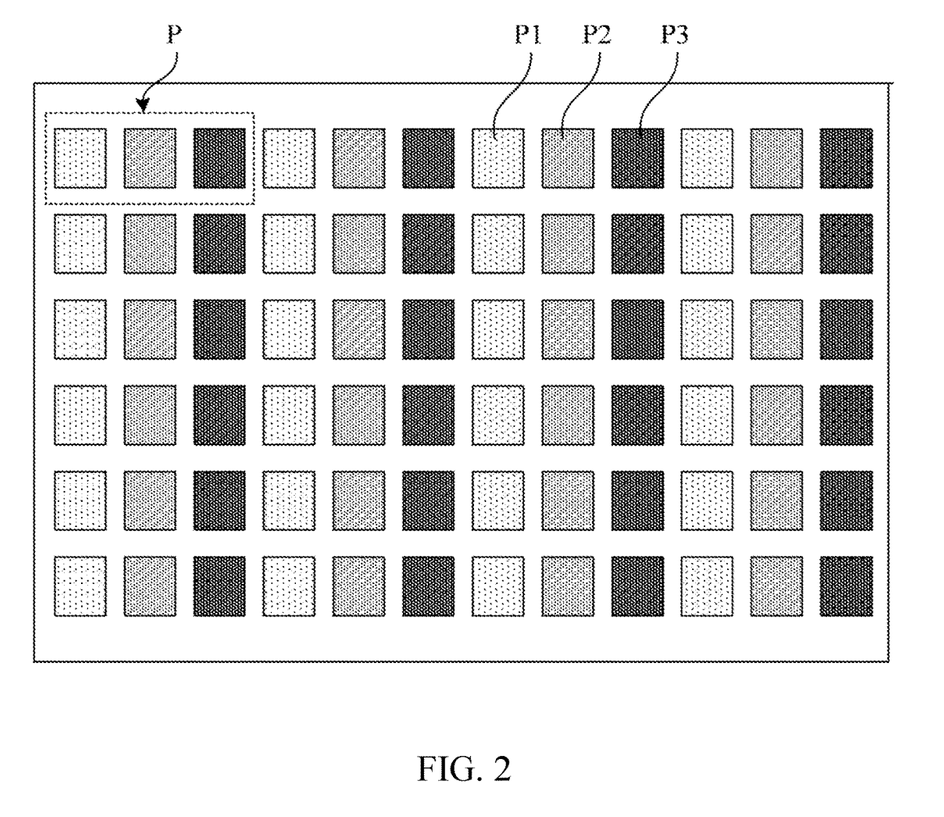
FIG. 2 is a schematic plan view of a display region of a display substrate.

FIG. 2 is a schematic plan view of a display region of a display substrate. As shown in FIG. 2, the display area may include a plurality of pixel units P arranged in a matrix, at least one of which includes a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 each include a pixel drive circuit and a light-emitting device. The pixel drive circuit in the first sub-pixel P1, the second sub-pixel P2, and the third sub-pixel P3 is connected with a scan signal line, a data signal line, and a light emitting signal line respectively. The pixel drive circuit is configured to receive a data voltage transmitted by the data signal line under control of the scan signal line and the light emitting signal line, and output a corresponding current to the light emitting device. The light emitting device in the first sub-pixel P1, the second sub-pixel P2, and the third sub-pixel P3 is connected with a pixel drive circuit of a sub-pixel where the light emitting device is located, and is configured to emit light with a corresponding brightness in response to a current output by the pixel drive circuit of the sub-pixel where the light emitting device is located.

In an exemplary embodiment, the pixel unit P may include a red (R) sub-pixel, a green (G) sub-pixel and a blue (B) sub-pixel, or may include a red sub-pixel, a green sub-pixel, a blue sub-pixel and a white (W) sub-pixel, or may emit white light, which is not limited in the present disclosure. In an exemplary embodiment, the shape of the sub-pixel in the pixel unit may be a rectangle, a rhombus, a pentagon or a hexagon. When the pixel unit includes three sub-pixels, the three sub-pixels may be arranged side by side horizontally, side by side vertically, or in a form of delta, and when the pixel unit includes four sub-pixels, the four sub-pixels may be arranged side by side horizontally, side by side vertically, or in a shape of a square, which is not limited in the present disclosure.

Figure 3:
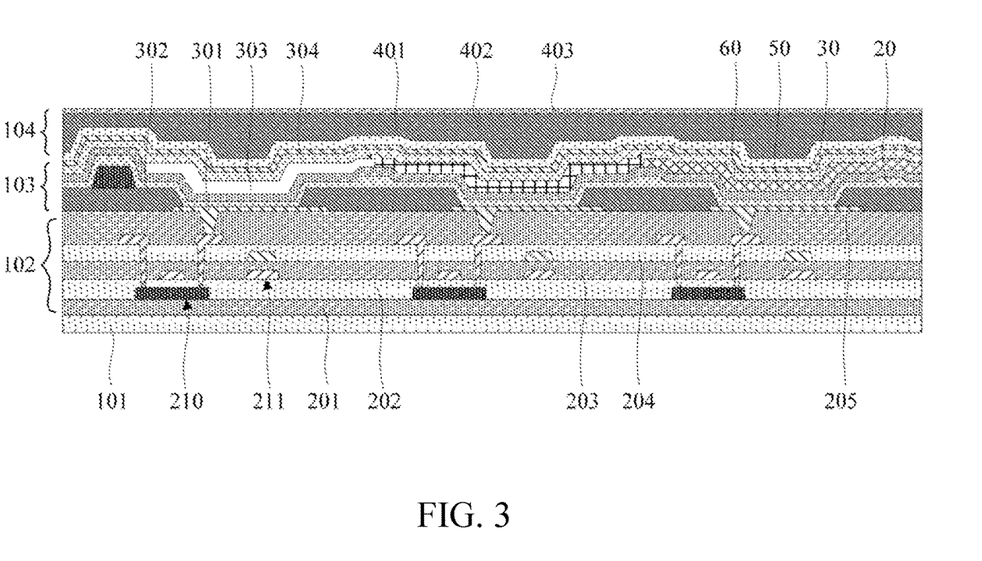
FIG. 3 is a schematic diagram of a sectional structure of a display substrate.

FIG. 3 is a schematic diagram of a sectional structure of a display substrate, which illustrates a structure of three sub-pixels of an OLED display substrate. Referring to FIG. 3, on a plane perpendicular to the display substrate, the display substrate may include a drive circuit layer 102 disposed on a base substrate 101, a light emitting device 103 disposed on a side of the drive circuit layer 102 far away from the base substrate 101, and an encapsulation layer 104 disposed on the side of the light emitting device 103 far away from the base substrate 101.

In an exemplary embodiment, the display substrate may include other film layers, such as a post spacer, which is not limited in the present disclosure.

In an exemplary embodiment, the base substrate may be a flexible base substrate, or may be a rigid base substrate. The flexible base may include a first flexible material layer, a first inorganic material layer, a semiconductor layer, a second flexible material layer and a second inorganic material layer which are stacked. Materials of the first flexible material layer and the second flexible material layer may be polyimide (PI), polyethylene terephthalate (PET) or surface treated polymer soft films; materials of the first inorganic material layer and the second inorganic material layer may be silicon nitride (SiNx) or silicon oxide (SiOx), for improving the water and oxygen resistance of the base; and a material of the semiconductor layer may be amorphous silicon (a-si).

In an exemplary embodiment, the driving circuit layer 102 of each sub-pixel may include a plurality of transistors and a storage capacitor constituting a pixel driving circuit. FIG. 3 illustrates an example in which each sub-pixel includes one driving transistor and one storage capacitor. In some possible implementations, the drive circuit layer 102 of each sub-pixel may include a first insulating layer 201 disposed on the base substrate; an active layer disposed on the first insulating layer; a second insulating layer 202 covering the active layer; a gate electrode and a first capacitor electrode disposed on the second insulating layer 202; a third insulating layer 203 covering the gate electrode and the first capacitor electrode; a second capacitor electrode disposed on the third insulating layer 203; a fourth insulating layer 204 covering the second capacitor electrode, the second insulating layer 202, the third insulating layer 203 and the fourth insulating layer 204 being provided with vias exposing the active layer; a source electrode and a drain electrode disposed on the fourth insulating layer 204, the source electrode and the drain electrode being respectively connected with the active layer through vias; a planarization layer 205 covering the structure and provided with vias exposing the drain electrode. The active layer, the gate electrode, the source electrode and the drain electrode form the driving transistor 210, and the first capacitor electrode and the second capacitor electrode form the storage capacitor 211.

In an exemplary embodiment, the light emitting device 103 may include an anode 301, a pixel definition layer 302, an organic light emitting layer 303 and a cathode 304. The anode 301 is disposed on the planarization layer 205, and is connected to the drain electrode of the drive transistor 210 through a via hole disposed on the planarization layer 205; the pixel define layer 302 is disposed on the anode 301 and the planarization layer 205, and the pixel define layer 302 is provided with a pixel opening exposing the anode 301; the organic light emitting layer 303 is at least partially disposed in the pixel opening, and is connected to the anode 301; the cathode 304 is disposed on the organic light emitting layer 303, and is connected to the organic light emitting layer 303; and the organic light emitting layer 303 emits light of corresponding colors under the drive of the anode 301 and the cathode 304.

In an exemplary embodiment, an encapsulation layer 104 may include a first encapsulation layer 401, a second encapsulation layer 402 and a third encapsulation layer 403 that are stacked; the first encapsulation layer 401 and the third encapsulation layer 403 may be made of an inorganic material, and the second encapsulation layer 402 may be made of an organic material; the second encapsulation layer 402 is disposed between the first encapsulation layer 401 and the third encapsulation layer 403 to ensure that external vapor may not enter into the emitting device 103.

In an exemplary embodiment, the organic light emitting layer 303 may at least include a hole injection layer 20, a hole transport layer 30, a light-emitting layer 50 and a hole block layer 60 which are stacked on the anode 301. In an exemplary embodiment, hole injection layers 20 of all sub-pixels are integrated layers connected together, hole transport layers 30 of all sub-pixels are integrated layers connected together, light emitting layers 50 of adjacent sub-pixels may be slightly overlapped with each other or may be separate from each other, and hole block layers 60 are integrated layers connected together.

Figure 4:
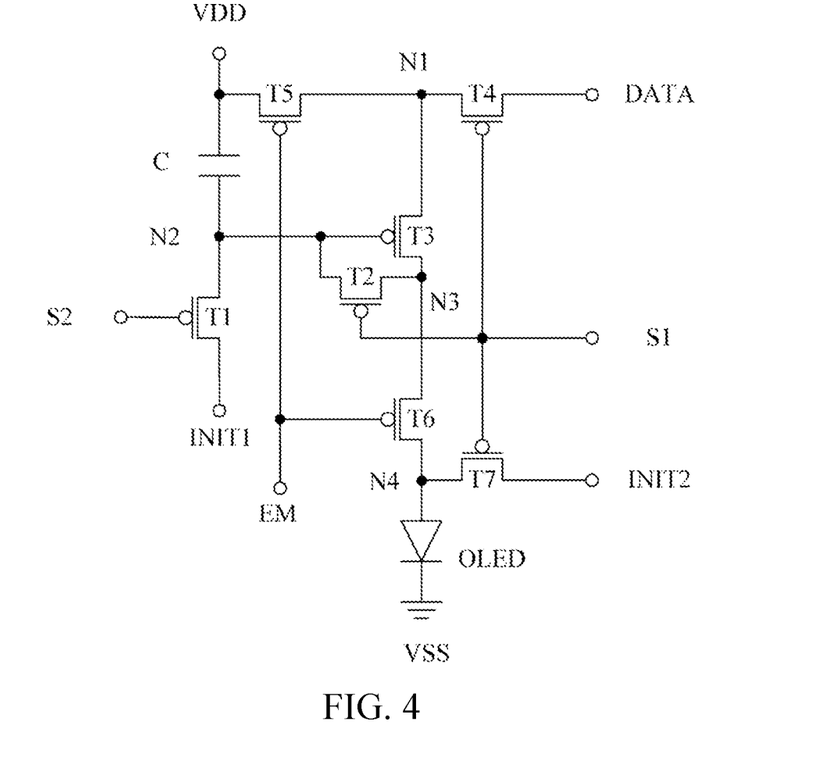
FIG. 4 is an equivalent circuit diagram of a pixel drive circuit.

In an exemplary embodiment, the pixel drive circuit may be of a 3T1C, 4T1C, 5T1C, 5T2C, 6T1C, or 7T1C structure. FIG. 4 illustrates an equivalent circuit diagram of a pixel drive circuit. Referring to FIG. 4, the pixel drive circuit may include seven switching transistors (first transistor T1 to seventh transistor T7), one storage capacitor C and eight signal lines (data signal line DATA, first scan signal line S1, second scan signal line S2, first initial signal line INIT1, second initial signal line INIT2, first power supply line VSS, second power supply line VDD and emitting signal line EM). The first initial signal line INIT1 and the second initial signal line INIT2 may be the same signal line.

In an exemplary embodiment, a control electrode of the first transistor T1 is connected to the second scan signal line S2, a first electrode of the first transistor T1 is connected to the first initial signal line INIT1, and a second electrode of the first transistor is connected to a second node N2. A control electrode of the second transistor T2 is connected with the first scan signal line S1, the first electrode of the second transistor T2 is connected with the second node N2, and the second electrode of the second transistor T2 is connected with the third node N3. A control electrode of the third transistor T3 is connected to the second node N2, a first electrode of the third transistor T3 is connected to a first node N1, and a second electrode of the third transistor T3 is connected to the third node N3. A control electrode of the fourth transistor T4 is connected to the first scan signal line S1, a first electrode of the fourth transistor T4 is connected to the data signal line DATA, and a second electrode of the fourth transistor T4 is connected to the first node N1. A control electrode of the fifth transistor T5 is connected to the emitting signal line EM, a first electrode of the fifth transistor T5 is connected to the second power supply line VDD, and a second electrode of the fifth transistor T5 is connected to the first node N1. A control electrode of the sixth transistor T6 is connected to the emitting signal line EM, a first electrode of the sixth transistor T6 is connected to the third node N3, and a second electrode of the sixth transistor T6 is connected to a first electrode of a light emitting device. A control electrode of the seventh transistor T7 is connected to the first scan signal line S1, a first electrode of the seventh transistor T7 is connected to the second initial signal line INIT2, and a second electrode of the seventh transistor T7 is connected to the first electrode of the light emitting device. A first terminal of the storage capacitor C is connected to the second power supply line VDD, and a second terminal of the storage capacitor C is connected to the second node N2.

In an exemplary embodiment, the first transistor T1 to the seventh transistor T7 may be P-type transistors, or may be N-type transistors. Use of a same type of transistors in a pixel drive circuit may simplify a process flow, reduce process difficulties of a display panel, and improve a product yield.

In an exemplary embodiment, the first transistor T1 to the seventh transistor T7 may include a P-type transistor and an N-type transistor.

In an exemplary embodiment, a second electrode of the light emitting device is connected to the first power supply line VSS. A signal of the first power supply line VSS is a low-level signal. A signal of the second power supply line VDD is a high-level signal continuously provided. The first scanning signal line S1 is a scanning signal line in a pixel drive circuit of a current display row, and the second scanning signal line S2 is a scanning signal line in a pixel drive circuit of a previous display row. That is, for an n-th display row, the first scanning signal line S1 is S(n), and the second scanning signal line S2 is S(n−1). The second scanning signal line S2 of the current display row and the first scanning signal line S1 in the pixel drive circuit of the previous display row are a same signal line, thus signal lines of the display panel may be reduced, so that a narrow bezel of the display panel is achieved.

An organic light emitting layer of a emitting light device may include an emitting layer (EML) and any one or more film layer of a Hole Injection Layer (HIL), a Hole Transport Layer (HTL), a Hole Block Layer (EIL), and an Electron Transport Layer (ETL). Under driving of voltages of the anode and the cathode, light is emitted according to the required gray scale using light emitting properties of the organic materials. Among them, the electron injection layer is in direct contact with the cathode. When the light emitting device works normally, the water and oxygen in the cathode will penetrate into the electron injection layer, and at the same time, the particles in the electron injection layer will migrate to other films, such that the electron injection layer has a low performance and it is difficult to inject electrons, reducing the stability of the light emitting device, and reducing the life of the light emitting device.

Figure 5:
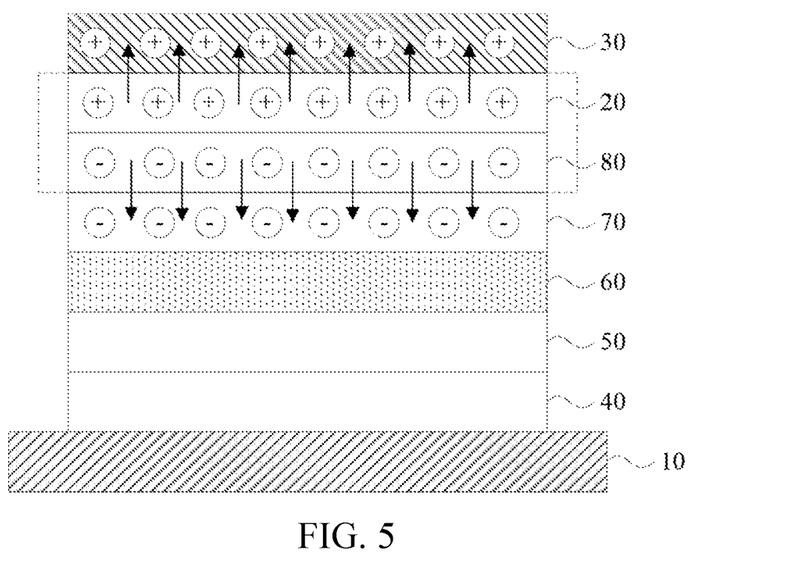
FIG. 5 is a schematic diagram of a structure of an organic light emitting device provided by an embodiment of the present disclosure.

FIG. 5 is a schematic diagram of a structure of an organic light emitting device provided by an embodiment of the present disclosure. As shown in FIG. 5, the organic light emitting device provided by the embodiment of the present disclosure includes an anode 10, an organic light emitting layer, a first transition protective layer 20 and a cathode 30 which are stacked sequentially. Among them, the organic light emitting layer may include a hole injection layer 40, a light emitting material layer 60, an electron transport layer 70 and an electron injection layer 80. A first transition protective layer 20 is disposed between the electron injection layer 80 and the cathode 30 and forms a PN junction with the electron injection layer 80. The organic light emitting layer may further include a hole transport layer 50.

In an exemplary embodiment, the hole injection layer 40 is configured to reduce a potential barrier of holes injected from the anode 10, so that the holes can be effectively injected into the light emitting material layer 60 from the anode. The hole transport layer 50 is configured to realize directed and ordered controllable migration of the injected electrons. The light emitting material layer 60 is configured to recombine electrons and holes to emit light. The electron transport layer 70 is configured to realize directed and ordered controllable migration of the injected electrons. The electron injection layer 80 is configured to reduce a potential barrier of holes injected from the cathode, so that the electrons can be effectively injected into the light emitting material layer 60 from the cathode.

In an exemplary embodiment, the organic light emitting device may be a bottom-emitting type or may be a top-emitting type.

In an exemplary embodiment, the anode layer serves as a connecting layer for the forward voltage of the organic light emitting device, having better electrical conductivity, visible light transparency, and higher work function. The Anode 10 may be made of a material having a high work function. For a bottom-emission type organic light emitting device, the anode may be made of a transparent oxide material such as indium tin oxide (ITO) or indium zinc oxide (IZO), and a thickness of the anode may be 80 nm to 200 nm. For a top-emission type organic light emitting device, the anode may adopt a composite structure of metal and transparent oxide, such as Ag/ITO, Ag/IZO or ITO/Ag/ITO. A thickness of the metal layer in the anode may be about 80 nm to 100 nm, and a thickness of the transparent oxide in the anode may be about 5 nm to 20 nm, so that the average reflectivity of the anode in the visible region is about 85% to 95%.

In an exemplary embodiment, the cathode layer serves as a connecting layer for the negative voltage of the organic light emitting device, having better electrical conductivity and lower work function. For a bottom-emission type organic light emitting device, the cathode may be made of magnesium (Mg), silver (Ag), aluminum (Al) or Mg:Ag alloy, and a thickness of the cathode may be greater than 80 nm, so that the cathode has good reflectivity. For the organic light emitting device, the cathode can be made of transparent oxide material, such as indium zinc oxide (IZO), etc., and a thickness of the cathode can be about 10 nm to 20 nm, so that the average transmittance of the cathode at the wavelength of 530 nm is about 50%~ 60%.

In an exemplary embodiment, the hole injection layer 40 may be made of an inorganic oxide, such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide, or may be made of P-type dopants with strong electron-withdrawing systems and dopants of hole transport materials, such as hexacyanohexaazatriphenylene, 2,3,5,6-Tetrafluoro-7,7',8,8'-tetracyanoquinodimethane (F4-TCNQ) dimethyl or 1,2,3-tri[(cyano)(4-cyano-2,3,5,6-tetrafluorophenyl)methylene]cyclopropane.

In an exemplary embodiment, a thickness of the hole injection layer 40 may be about 5 nm to 20 nm.

In an exemplary embodiment, the hole transport layer 50 may be made of hole transport materials with high hole mobility, such as aromatic amines with hole transport features, and its substituent groups may be carbazole, methylfluorene, spirofluorene, dibenzothiophene, or furan, such as 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4-phenyl-4'-(9-phenylfluoren–9-yl)triphenylamine (BAFLP), 4,4'-bis[N-(9,9-dimethylfluoren–2-yl)-N-phenylamino]biphenyl (DFLDPBi), 4,4'-bis(9-carbazolyl)biphenyl or (CBP) 9-phenyl-3-[4-(10-phenyl-9-anthryl)phenyl]-9H-carbazole (PCzPA).

In an exemplary embodiment, a thickness of the hole transport layer 50 may be about 80 nm to 120 nm, and the carrier mobility of the fabrication material of the hole transport layer may be about $10^{-3}$ cm$^2$/Vs to $10^{-5}$ cm$^2$/Vs.

In some exemplary embodiments, the conductivity of the hole transport layer 50 is less than or equal to the conductivity of the hole injection layer 40.

In an exemplary embodiment, the electron transport layer 70 may use aromatic heterocyclic compounds, for example, imidazole derivatives such as benzimidazole derivatives, imidazopyridine derivatives, and benzimidazophenanthridine derivatives; azine derivatives such as pyrimidine derivatives and triazine derivatives; quinoline derivatives, isoquinoline derivatives, phenanthroline derivatives, compounds containing a nitrogen-containing six-membered ring structure (including compounds having a phosphine oxide-based substituent on the heterocyclic ring), etc. For example, 2-(4-biphenyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-tert-butylphenyl)-4-phenyl-5-(4-biphenyl)-1,2,4-Triazole (TAZ), 3-(4-tert-butylphenyl)-4-(4-ethylphenyl)-5-(4-biphenyl)-1,2,4-triazole (p-EtTAZ), bathophenanthroline (BPhen), bathocuproine (BCP), or 4,4'-bis(5-methylbenzoxazol-2-yl)stilbene (BzOs), etc.

In an exemplary embodiment, a thickness of the electron transport layer may be about 20 nm to 70 nm.

In an exemplary embodiment, a fabrication material of the electron injection layer 80 may include an N-doping organic material. Among them, the electron injection layer adopts a doping structure, and includes host material and doping material, wherein the doping material may be an N-doping material, and the host material and doping material are doped according to a certain proportion to form the doping structure. A host material of the electron injection layer 80 may be an organic molecular material having high electron mobility and being capable of effectively conducting electrons.

In an exemplary embodiment, a host material of the electron injection layer 80 may be the same as the fabrication material of the electron transport layer 70.

In an exemplary embodiment, a doping material of the electron injection layer 80 may be lithium fluoride or a complex of lithium and cesium carbonate.

In an exemplary embodiment, a fabrication material of the first transition protective layer 20 may be a P-doping organic material. The first transition protective layer is functionally equivalent to a hole injection layer and a hole transport layer. A host material of the first transition protective layer 20 is an organic material such as an organic molecular material having high hole mobility and being capable of effectively conducting hole. A doping material of the first transition protective layer may be a P-doping material.

In an exemplary embodiment, a host material of the first transition protective layer 20 may be the same as the fabrication material of the hole transport layer.

In an exemplary embodiment, a doping material of the first transition protective layer 20 may be molybdenum trioxide or may be tungsten trioxide or vanadium pentoxide.

In an exemplary embodiment, a thickness of the light emitting material layer 60 may be about 10 nm to 30 nm, and for example, the thickness of the light emitting material layer 60 may be about 15 nm to 25 nm.

In an exemplary embodiment, for organic light emitting devices emitting monochromatic light, organic light emitting devices with different colors have different light emitting material layers. For example, a red light emitting device includes a red light emitting material layer, a green light emitting device includes a green light emitting material layer, and a blue light emitting device includes a blue light emitting material layer. For an organic light emitting device emitting white light, each sub-pixel includes the same organic light emitting device.

In an exemplary embodiment, the light emitting material layer 60 may include a light emitting host material and a light emitting guest material. A doping ratio of the guest material of the light emitting material layer is 1% to 20%. Within a range of the doping ratio, on one hand, the host material in the light emitting material layer may effectively transfer exciton energy to the dopant material in the emitting layer to excite the dopant material in the emitting layer to emit light; on the other hand, the host material in the light emitting material layer "dilutes" the dopant material in the light emitting material layer, thereby effectively improving fluorescence quenching caused by collisions between molecules of the dopant material in the light emitting material layer and collisions between energy, and improving a luminous efficiency and device life.

In an exemplary embodiment, the doping ratio refers to a ratio of a mass of the guest material to a mass of the light emitting material layer, that is, a mass percentage. In an exemplary embodiment, the host material and the dopant material may be co-evaporated through a multi-source evaporation process, so that the host material and the dopant material are uniformly dispersed in the light emitting material layer. A doping ratio may be adjusted by controlling an evaporation rate of the dopant material or by controlling an evaporation rate ratio of the host material to the dopant material during an evaporation process.

In an exemplary embodiment, the light emitting host material may employ a bipolar single host or may employ a dual host formed by blending a hole-type host and an electron-type host. The light-emitting guest material may be a phosphorescent material, a fluorescent material, a delayed fluorescent material and the like. The doping ratio of the light-emitting guest material is about 5% to 15%.

In an exemplary embodiment, the orthographic projections of the light emitting material layers of at least part of sub-pixels on the substrate overlap with an orthographic projection of the pixel drive circuit on the substrate.

In an exemplary embodiment, any one or more of the hole injection layer, the hole transport layer, the electron injection layer, and the electron transport layer may be prepared by one process (one evaporation process or one ink-jet printing process), while isolation is achieved by surface segment difference or surface treatment of the formed film layers, etc. For example, any one or more of a hole injection layer, a hole transport layer, an electron injection layer, and an electron transport layer corresponding to adjacent sub-pixels may be isolated. In an exemplary embodiment, the organic light emitting layer may be formed by evaporation using a Fine Metal Mask (FMM) or an Open Mask, or by ink jet process.

As shown in FIG. 5, the PN junction in the embodiment of the present disclosure may serve as an intermediate connector, which is equivalent to a charge generation layer, such that hole carriers may be injected from the first transition protective layer 20 to the cathode 30, and electron carriers may be injected from the electron injection layer 80 to the electron transport layer 70.

When the cathode is fabricated by a sputtering process, the external quantum efficiency loss in the organic light emitting device is greater closer to the cathode, and the first transition protective layer disposed by the present disclosure may reduce the external quantum efficiency loss of the electron injection layer close to the cathode.

The organic light emitting device provided by the embodiment of the present disclosure includes an anode, an organic light emitting layer, a first transition protective layer and a cathode which are stacked sequentially; the organic light emitting layer includes a hole injection layer, a light emitting material layer, an electron transport layer and an electron injection layer; and a first transition protective layer is disposed between the electron injection layer and the cathode, and forms a PN junction with the electron injection layer. The first transition protective layer which can form a PN junction with the electron injection layer is disposed between the electron injection layer and the cathode by the present disclosure, such that the hole carriers are injected from the first transition protective layer to the cathode, and the electron carriers are injected from the electron injection layer to the electron transport layer, thereby improving the conductivity, strengthening the ability of injecting electrons into the light emitting layer, balancing the electrons and holes, and increasing the recombination rate; and the existence of the first transition protective layer may be served as a protective layer of the electron injection layer, which alleviates the direct contact of water and oxygen penetrated from the cathode with the electron injection layer and improves the stability and life of the OLED.

Figure 6:
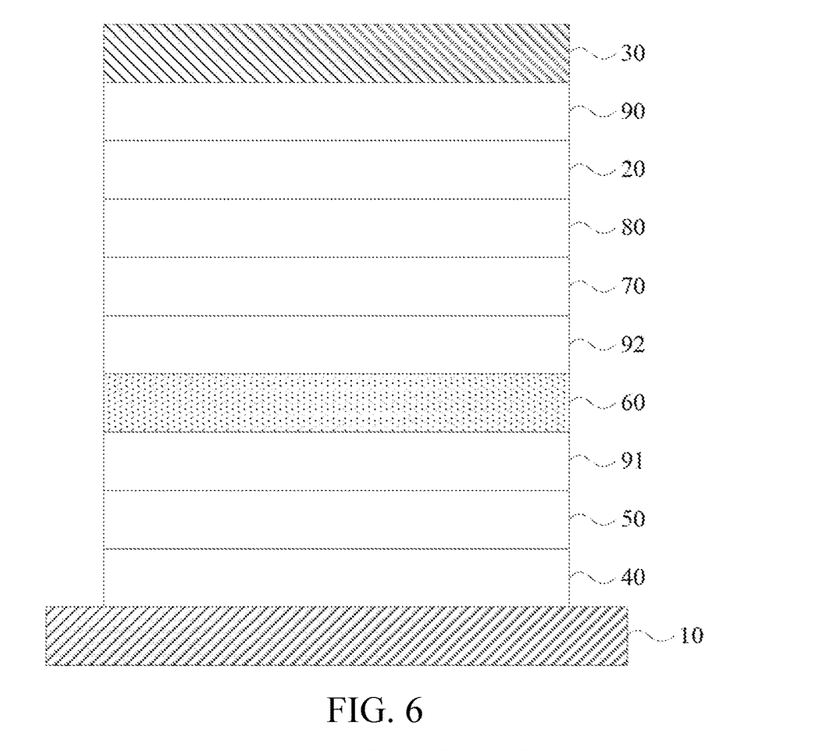
FIG. 6 is a structural schematic diagram of the organic light emitting device provided by an illustrative embodiment.

FIG. 6 is a structural schematic diagram of the organic light emitting device provided by an illustrative embodiment. As shown in FIG. 6, the organic light emitting device provided by an exemplary embodiment further includes a second transition protective layer 90 disposed between the first transition protective layer 20 and the cathode 30, and a PN junction formed by the second transition protective layer 90 with the first transition protective layer 80.

In an exemplary embodiment, a fabrication material of the second transition protective layer 90 includes an N-doping organic material.

In an exemplary embodiment, a fabrication material of the second transition protective layer 90 may be the same as a fabrication material of the electron injection layer, and that is, a host material of the second transition protective layer may be made of aromatic heterocyclic compounds, for example, imidazole derivatives such as benzimidazole derivatives, imidazopyridine derivatives, benzimidazole phenanthridine derivatives, etc.; oxazine derivatives such as pyrimidine derivatives and triazine derivatives; and chemical compounds, such as quinoline derivatives, isoquinoline derivatives, and phenanthroline derivatives, including nitrogen-containing hexatomic ring structures (including the compounds with phosphine oxide substituents on heterocycles). For example, 2-(4-biphenyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-tert-butylphenyl)-4-phenyl-5-(4-biphenyl)-1,2,4-Triazole (TAZ), 3-(4-tert-butylphenyl)-4-(4-ethylphenyl)-5-(4-biphenyl)-1,2,4-triazole (p-EtTAZ), bathophenanthroline (BPhen), bathocuproine (BCP), or 4,4'-bis(5-methylbenzoxazol-2-yl) stilbene (BzOs), etc. A doping material of the second transition protective layer is lithium fluoride or a complex of lithium and cesium carbonate.

A second transition protective layer that can cooperate with the first transition protective layer is disposed by an exemplary embodiment such that electron carriers are injected from the electron injection layer to the electron transport layer, thereby improving conductivity, strengthening the ability to inject electrons into the light emitting layer, balancing electrons and holes, and increasing the recombination rate; and in addition, the existence of the second transition protective layer may also be used as a protective layer of the electron injection layer, which alleviates the direct contact of water and oxygen penetrated from the cathode with the electron injection layer and improves the stability and life of the OLED.

In an exemplary embodiment, the number of electron injection layers is greater than or equal to one. When the organic light emitting device is a bottom-emission structure, the number of electron injection layers is equal to 1. When the organic light emitting device is a top-emission structure, and the organic light emitting device is a top-emission structure and emits white light, the number of the electron injection layers is greater than 1, and the number of the electron injection layers is equal to 3. FIG. 5 and FIG. 6 are illustrated by taking the number of the electron injection layers being equal to 1 as an example.

As shown in FIG. 5, in an exemplary embodiment, when the number of the electron injection layers is 1, the hole injection layer 40 is located between the light emitting material layer 60 and the anode 10, the hole transport layer 50 is located between the hole injection layer 40 and the light emitting material layer 60, and the electron transport layer 70 is located between the light emitting material layer 60 and the electron injection layer 80.

In an exemplary embodiment, a fabrication material of the hole injection layer 40 may be a P-doping organic material. Among them, the hole injection layer adopts a doping structure, and includes a host material and a doping material, wherein the doping material is a P-doping material, and the host material and doping material are doped according to a certain proportion to form doping structure. P-doping material is a kind of material with strong electron-withdrawing ability, which lacks electrons and has strong ability to withdraw electrons. Therefore, due to the strong electron-withdrawing ability of the P-doping material, electrons move rapidly toward the anode under the action of electric field, and holes are rapidly cause transported toward the hole transport layer, thus achieving efficient hole injection performance.

In an exemplary embodiment, a host material of the hole injection layer may include aromatic amines with hole transport features, and its substituent groups may be carbazole, methylfluorene, spirofluorene, dibenzothiophene, or furan, such as 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4-phenyl-4'-(9-phenylfluoren–9-yl)triphenylamine (BAFLP), 4,4'-bis[N-(9,9-dimethylfluoren–2-yl)-N-phenylamino]biphenyl (DFLDPBi), 4,4'-bis(9-carbazolyl)biphenyl (CBP) or 9-phenyl-3-[4-(10-phenyl-9-anthryl)phenyl]-9H-carbazole (PCzPA). A doping material of the hole injection layer may be an inorganic oxide, such as a molybdenum oxide, a titanium oxide, a vanadium oxide, a rhenium oxide, a ruthenium oxide, a chromium oxide, a zirconium oxide, a hafnium oxide, a tantalum oxide, a silver oxide, a tungsten oxide, or a manganese oxide, for example molybdenum trioxide, or may be tungsten trioxide or vanadium pentoxide.

Figure 7:
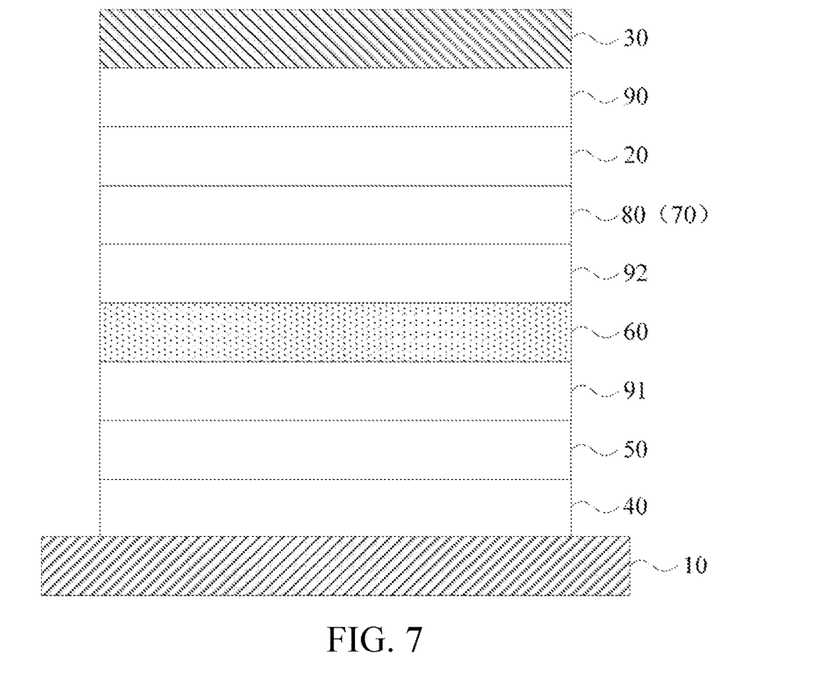
FIG. 7 is a structural schematic diagram of the organic light emitting device provided by another illustrative embodiment.

FIG. 7 is a schematic diagram of a structure of an organic light emitting device provided by another exemplary embodiment. As shown in FIG. 7, in the organic light emitting device provided by another exemplary embodiment, when the number of the electron injection layers is 1, the electron injection layer 80 and the electron transport layer 70 are the same film layer; and the hole injection layer 40 is located between the light emitting material layer 60 and the anode 10, the hole transport layer 50 is located between the hole injection layer 40 and the light emitting material layer 60, and the electron injection layer 80 is located between the light emitting material layer 60 and the first transition protective layer 20.

In an exemplary embodiment, a fabrication material of the hole injection layer 40 may be a P-doping organic material. Among them, the hole injection layer adopts a doping structure, and includes a host material and a doping material, wherein the doping material is a P-doping material, and the host material and doping material are doped according to a certain proportion to form doping structure. P-doping material is a kind of material with strong electron-withdrawing ability, which lacks electrons and has strong ability to withdraw electrons. Therefore, due to the strong electron-withdrawing ability of the P-doping material, electrons move rapidly toward the anode under the action of electric field, and holes are rapidly cause transported toward the hole transport layer, thus achieving efficient hole injection performance.

In an exemplary embodiment, a host material of the hole injection layer may include aromatic amines with hole transport features, and its substituent groups may be carbazole, methylfluorene, spirofluorene, dibenzothiophene, or furan, such as 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4-phenyl-4'-(9-phenylfluoren-9-yl)triphenylamine (BAFLP), 4,4'-bis[N-(9,9-dimethylfluoren-2-yl)-N-phenylamino]phenyl (DFLDPBi), 4,4'-bis(9-carbazolyl)biphenyl (CBP) or 9-phenyl-3-[4-(10-phenyl-9-anthryl)phenyl]-9H-carbazole (PCzPA). A doping material of the hole injection layer may be an inorganic oxide, such as a molybdenum oxide, a titanium oxide, a vanadium oxide, a rhenium oxide, a ruthenium oxide, a chromium oxide, a zirconium oxide, a hafnium oxide, a tantalum oxide, a silver oxide, a tungsten oxide, or a manganese oxide, for example molybdenum trioxide, or may be tungsten trioxide or vanadium pentoxide.

In an exemplary embodiment, a hole injection layer and a hole transport layer which are located on one side of the light emitting material layer may be the same film layer, and an electron injection layer and an electron transport layer which are on the other side of the light emitting material layer may be the same film layer, thereby reducing process difficulty and improving yield.

In an exemplary embodiment, as shown in FIG. 6 and FIG. 7, the organic light emitting layer may further include an electron block layer 91 and a hole block layer 92. The hole block layer 92 is located between the light emitting material layer 60 and the electron transport layer 70, and the electron block layer 91 is located between the light emitting material layer 60 and the hole transport layer 50.

In an exemplary embodiment, the electron block layer may be made of aromatic amines with hole transport features, and its substituent groups may be carbazole, methylfluorene, spirofluorene, dibenzothiophene, or furan, such as 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4-phenyl-4'-(9-phenylfluoren-9-yl)triphenylamine (BAFLP), 4,4'-bis[N-(9,9-dimethylfluoren-2-yl)-N-phenylamino]biphenyl (DFLDPBi), 4,4'-bis(9-carbazolyl)biphenyl (CBP) or 9-phenyl-3-[4-(10-phenyl-9-anthryl)phenyl]-9H-carbazole (PCzPA).

In an exemplary embodiment, a thickness of the electron block layer 91 may be about 1 nm to 20 nm and be configured to transfer holes, block electrons and excitons generated within the light emitting material layer.

In an exemplary embodiment, a conductivity of the electron block layer 91 is less than or equal to a conductivity of the hole injection layer 40.

In an exemplary embodiment, a thickness of the hole block layer 92 is about 2 nm to 20 nm and is configured to block holes and excitons generated within the light-emitting layer.

In an exemplary embodiment, a thickness of the light emitting material layer 60 is different from that of the hole block layer 60. For example, a thickness of the light emitting material layer 60 may be greater than that of the hole block layer 92.

In an exemplary embodiment, a thickness of the light emitting material layer 60 is different from that of the electron block layer 91. For example, a thickness of the light emitting material layer 60 may be greater than that of the electron block layer 91.

As shown in FIG. 6 and FIG. 7, in an exemplary embodiment, when the organic light emitting device is a bottom-emitting organic light emitting device, the anode may be a transparent electrode and the cathode may be a reflective electrode.

Figure 8:
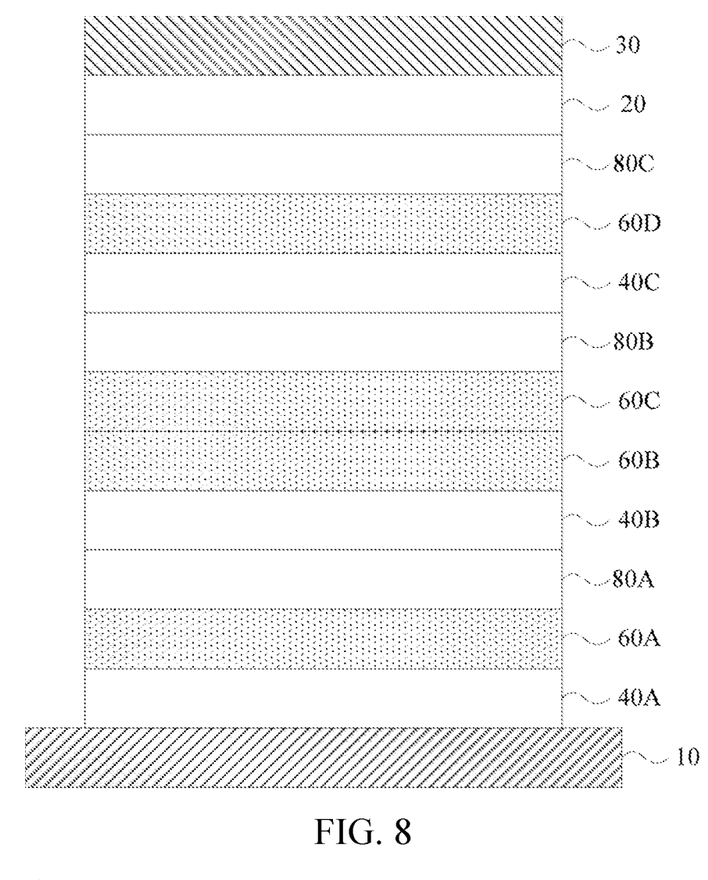
FIG. 8 is a structural schematic diagram of the organic light emitting device provided by yet another illustrative embodiment.

FIG. 8 is a structural schematic diagram of the organic light emitting device provided by yet another illustrative embodiment. As shown in FIG. 8, in an organic light emitting device provided by an exemplary embodiment, when the number of the electron injection layers is greater than 1, the ith electron injection layer is located on a side of the (i+1)th electron injection layer close to the anode; 1≤I≤N−1, N is the number of electron injection layers. The first transition protective layer and the Nth electron injection layer form a PN junction. FIG. 8 is illustrated by taking N=3 as an example. As shown in FIG. 8, the three electron injection layers include a first electron injection layer 80A, a second electron injection layer 80B and a third electron injection layer 80C.

As shown in FIG. 8, the number of hole injection layers in the organic light emitting layer is three, and the number of light emitting material layers is four. Among them, the three hole injection layers include a first hole injection layer 40A, a second hole injection layer 40B and a third hole injection layer 40C. The four light emitting material layers include a first light emitting material layer 60A, a second light emitting material layer 60B, a third light emitting material layer 60C, and a fourth light emitting material layer 60D.

The first light emitting material layer 60 is located between the first hole injection layer 40A and the first electron injection layer 80A, the first hole injection layer 40A is located on a side of the first light emitting material layer 60A close to the anode 10, and the first electron injection layer 80A is located on a side of the first light emitting material layer 60A away from the anode 10; The second light emitting material layer 60B and the third light emitting material layer 60C are located between the second hole injection layer 40B and the second electron injection layer 80B, the third light emitting material layer 60C is located on a side of the second light emitting material layer 60B away from the anode 10, the second hole injection layer 40B is located on a side of the second light emitting material layer 60B close to the anode 10, and the second electron injection layer 80B is located on a side of the third light emitting material layer 60C away from the anode 10. The fourth light emitting material layer 60D is located between the third hole injection layer 40C and the third electron injection layer 80C, the third hole injection layer 40C is located on a side of the fourth light emitting material layer 60D close to the anode 10, and the third electron injection layer 80C is located on a side of the fourth light emitting material layer 60D away from the anode 10. The second hole injection layer 40B is located between the first electron injection layer 80A and the second light emitting material layer 60B, and the third hole injection layer 40C is located between the second electron injection layer 80B and the fourth light emitting material layer 60D; and the first transition protective layer 20 is located between the third electron injection layer 80C and the cathode 30. The third electron injection layer 80C, that is an electron injection layer forming a PN junction with the first transition protective layer, may be multiplexed into an electron transport layer.

In an exemplary embodiment, a fabrication material of the first light emitting material layer 60A is the same as a fabrication material of the fourth light emitting material layer 60D, and is a blue light emitting material. In an exemplary embodiment, the blue light emitting material may be 9,10-di-p-tetrastylethylanthracene.

In an exemplary embodiment, the second light emitting material layer 60B is a red light emitting material. In an exemplary embodiment, the red light emitting material may be 9, 10-di-p-N, N-diheptylstyrene anthracene.

In an exemplary embodiment, the third light emitting material layer 60C is a yellow light emitting material. In an exemplary embodiment, the yellow light emitting material may be 9, 10-di-p-N, N-dipropylstyrene anthracene.

In an exemplary embodiment, a fabrication material of the hole injection layer 40 may be a P-doping organic material. Among them, the hole injection layer adopts a doping structure, and includes a host material and a doping material, wherein the doping material is a P-doping material, and the host material and doping material are doped according to a certain proportion to form doping structure. P-doping material is a kind of material with strong electron-withdrawing ability, which lacks electrons and has strong ability to withdraw electrons. Therefore, due to the strong electron-withdrawing ability of the P-doping material, electrons move rapidly toward the anode under the action of electric field, and holes are rapidly cause transported toward the hole transport layer, thus achieving efficient hole injection performance.

In an exemplary embodiment, a host material of the hole injection layer may include aromatic amines with hole transport features, and its substituent groups may be carbazole, methylfluorene, spirofluorene, dibenzothiophene, or furan, such as 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4-phenyl-4'-(9-phenylfluoren–9-yl)triphenylamine (BAFLP), 4,4'-bis[N-(9,9-dimethylfluoren–2-yl)-N-phenylamino]biphenyl (DFLDPBi), 4,4'-bis(9-carbazolyl)biphenyl (CBP) or 9-phenyl-3-[4-(10-phenyl-9-anthryl)phenyl]-9H-carbazole (PCzPA). A doping material of the hole injection layer may be an inorganic oxide, such as a molybdenum oxide, a titanium oxide, a vanadium oxide, a rhenium oxide, a ruthenium oxide, a chromium oxide, a zirconium oxide, a hafnium oxide, a tantalum oxide, a silver oxide, a tungsten oxide, or a manganese oxide, for example molybdenum trioxide, or may be tungsten trioxide or vanadium pentoxide.

In an exemplary embodiment, a thickness of the hole injection layer is about 20 nm to 80 nm.

In an exemplary embodiment, a thickness of the electron injection layer is about 0.5 nm to 10 nm.

In an exemplary embodiment, when the organic light emitting device is a top-emission structure which emits white light, the anode may be a transparent electrode and the cathode may be a transparent electrode.

In an exemplary embodiment, for an organic light emitting device of the top-emission type, a thickness of the organic light emitting layer between the cathode and the anode may be designed to meet a requirement on an optical path of an optical micro-resonator, so as to obtain optimal light output intensity and color.

In an exemplary embodiment, an orthographic projection of one or more of the hole injection layer, the hole transport layer, the electron block layer, the hole block layer, the electron transport layer, the electron injection layer, and the cathode on the substrate is continuous. In some examples, at least one of the hole injection layer, the hole transport layer, the electron block layer, the hole block layer, the electron transport layer, the electron injection layer, and the cathode of at least one row or column of sub-pixels is communicated. In some examples, at least one of the hole injection layer, the hole transport layer, the electron block layer, the hole block layer, the electron transport layer, the electron injection layer, and the cathode of multiple sub-pixels is communicated.

In an exemplary embodiment, hole injection layers of all sub pixels may be connected together to form a communicated layer, electron injection layers of all the sub pixels may be connected together to form a communicated layer, hole transport layers of all the sub pixels may be connected together to form a communicated layer, electron transport layers of all the sub pixels may be connected together to form a communicated layer, hole block layers of all the sub pixels may be connected together to form a communicated layer, emitting layers of adjacent sub pixels may be overlapped slightly, or may be isolated from each other, and electron block layers of adjacent sub pixels may be overlapped slightly, or may be isolated from each other.

A performance of the organic light emitting device provided by the embodiment of the present disclosure is analyzed through an experiment, and the analysis result is shown in Table 1. The device I is an organic light emitting device provided by the embodiment of the present disclosure, and the device II is an organic light emitting device without being provided a first transition protective layer and a second transition protective layer. Among them, the time required for brightness decrease refers to the time required for brightness to decrease from 100 to 95.

TABLE 1

| Device | Current Density | Voltage | Light Emitting Efficiency | External Quantum Efficiency | Chroma Abscissa | Chroma Ordinate | Time Required For Brightness Decrease |
| --- | --- | --- | --- | --- | --- | --- | --- |
| Device I | 10 | 11.88 | 64.77 | 28.11 | 0.2927 | 0.3163 | 180 |
| Device II | 10 | 11.90 | 61.53 | 26.71 | 0.2931 | 0.3163 | 153 |

According to Table 1, when the current density, voltage and chroma coordinates of device I and device II are approximately the same, the light emitting efficiency of device I is higher than that of device II, the time required for the brightness to decrease from 100 to 95 is longer, and the external quantum efficiency is higher than that of device II.

Figure 9:
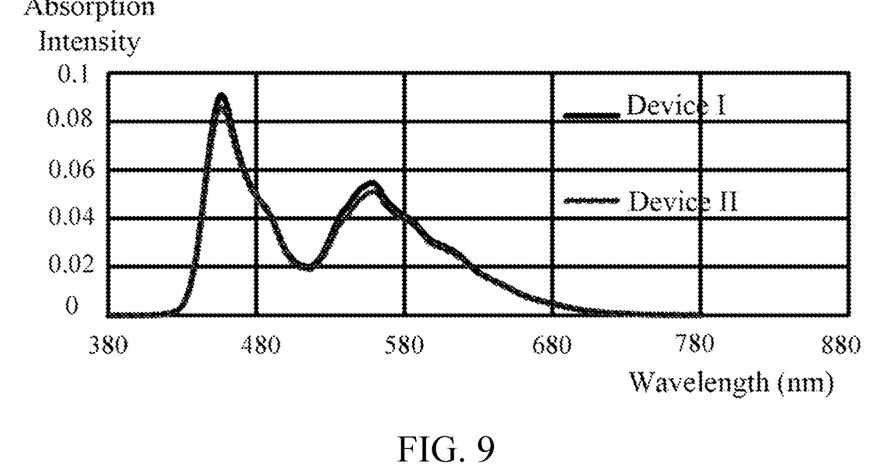
FIG. 9 is a spectrogram corresponding to device I and device II.
Figure 10:
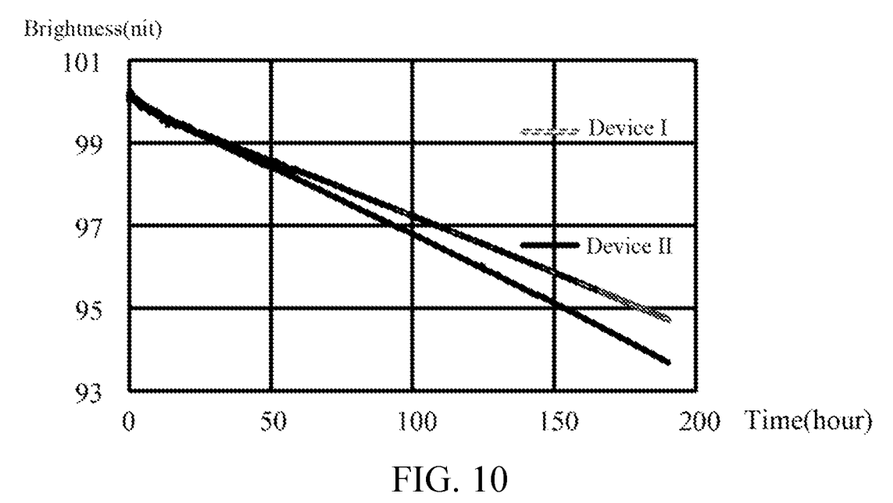
FIG. 10 is a corresponding relationship between brightness and time corresponding to the device I and the device II.

In an exemplary embodiment, FIG. 9 is a spectrogram corresponding to the device I and the device II, and FIG. 10 is a corresponding relationship between the brightness and the time corresponding to device I and device II. As can be seen from FIG. 9, the absorption intensity of device I is higher when device I and device II are at the same wavelength. As shown in FIG. 10, the time required for the device I is longer than that required for the device II on a condition of decreasing the same brightness. Compared to device II, device I has a higher performance.

In an exemplary embodiment, a display substrate including the organic light emitting device as shown in FIG. 6 may be formed in the following manner. A driving circuit layer is formed on a substrate through a patterning process, and the driving circuit layer of each sub-pixel may include a driving transistor and a storage capacitor constituting a pixel driving circuit. A flat layer is formed on the substrate on which the aforementioned structure is formed, and a via hole exposing a drain electrode of the driving transistor is formed on a flat layer of each sub-pixel. An anode is formed by a patterning process on the substrate on which the aforementioned structure is formed, and the anode of each sub-pixel is connected with the drain electrode of the driving transistor through the via hole on the flat layer. A pixel defining layer is formed by a patterning process on the substrate on which the aforementioned structure is formed, a pixel opening exposing the anode is formed on the pixel defining layer of each sub-pixel, and each pixel opening serves as a light-emitting area of each sub-pixel. On the substrate on which the aforementioned structure is formed, firstly, an open mask is used to evaporate a hole injection layer, a hole transport layer and an electron block layer in sequence to form a communicated layer of the hole injection layer, the hole transport layer and the electron block layer on the display substrate. That is, the hole injection layers of all sub-pixels are communicated, and the electron block layers of all sub-pixels are communicated. For example, the hole injection layer, the hole transport layer and the electron block layer have approximately the same area but different thicknesses. Then, a fine metal mask is used to evaporate the red, green and blue light emitting material layers in different sub-pixels, and the light emitting material layers of adjacent sub-pixels may overlap in a small portion (for example, the overlapping portion accounts for less than 10% of the area of the pattern of the respective light-emitting layer), or they may be isolated. Then, an open mask is used to evaporate the hole block layer, the electron transport layer, the electron injection layer and the cathode in sequence to form a communicated layer of the hole block layer, the electron transport layer, the electron injection layer and the cathode on the display substrate. That is, the hole block layers of all sub-pixels are communicated, the electron transport layers of all sub-pixels are communicated, and the cathodes of all sub-pixels are communicated.

In an exemplary embodiment, a display substrate including the organic light emitting device as shown in FIG. 7 may be formed in the following manner. A driving circuit layer is formed on a substrate through a patterning process, and the driving circuit layer of each sub-pixel may include a driving transistor and a storage capacitor constituting a pixel driving circuit. A flat layer is formed on the substrate on which the aforementioned structure is formed, and a via hole exposing a drain electrode of the driving transistor is formed on a flat layer of each sub-pixel. An anode is formed by a patterning process on the substrate on which the aforementioned structure is formed, and the anode of each sub-pixel is connected with the drain electrode of the driving transistor through the via hole on the flat layer. A pixel defining layer is formed by a patterning process on the substrate on which the aforementioned structure is formed, a pixel opening exposing the anode is formed on the pixel defining layer of each sub-pixel, and each pixel opening serves as a light-emitting area of each sub-pixel. On the substrate on which the aforementioned structure is formed, firstly, an open mask is used to evaporate the hole injection layer and the electron block layer in sequence to form a communicated layer of the hole injection layer and the electron block layer on the display substrate. That is, the hole injection layers of all sub-pixels are communicated, and the electron block layers of all sub-pixels are communicated. For example, the hole injection layer and the electron block layer have approximately the same area but different thicknesses. Then, a fine metal mask is adopted to evaporate the red, green and blue light emitting material layers in different sub-pixels, and the light emitting material layers of adjacent sub-pixels may overlap in a small portion (for example, the overlapping portion accounts for less than 10% of the area of the pattern of the respective light-emitting layer), or they may be isolated. Subsequently, the hole block layer, the electron injection layer and the cathode are sequentially evaporated by adopting the open mask. Communicated layers of the hole block layers, the electron injection layers and the cathodes are formed on the display substrate, that is, the hole block layers of all sub-pixels are connected, the electron injection layers of all sub-pixels are communicated, and the cathodes of all sub-pixels are communicated.

In an exemplary embodiment, a display substrate including the organic light emitting device as shown in FIG. 8 may be formed in the following manner. A driving circuit layer is formed on a substrate through a patterning process, and the driving circuit layer of each sub-pixel may include a driving transistor and a storage capacitor constituting a pixel driving circuit. A flat layer is formed on the substrate on which the aforementioned structure is formed, and a via hole exposing a drain electrode of the driving transistor is formed on a flat layer of each sub-pixel. An anode is formed by a patterning process on the substrate on which the aforementioned structure is formed, and the anode of each sub-pixel is connected with the drain electrode of the driving transistor through the via hole on the flat layer. A pixel defining layer is formed by a patterning process on the substrate on which the aforementioned structure is formed, a pixel opening exposing the anode is formed on the pixel defining layer of each sub-pixel, and each pixel opening serves as a light-emitting area of each sub-pixel. On the substrate on which the aforementioned structure is formed, the open mask is adopted to evaporate a first hole injection layer, the fine metal mask is adopted to evaporate a first emitting light material layer, the open mask is adopted to evaporate a first electron injection layer and the second hole injection sequentially, the fine metal mask is adopted to evaporate a second light emitting material layer and a third light emitting material sequentially, the open mask is adopted to evaporate a second electron injection layer and a third hole injection layer, the fine metal mask is adopted to evaporate a fourth light emitting material layer sequentially, and the open mask is adopted to evaporate a third electron injection layer, a first transition protective layer and a cathode sequentially. The light emitting material layers of adjacent sub-pixels may overlap in a small portion (for example, the overlapping portion accounts for less than 10% of the area of the pattern of the respective light-emitting layer) or may be isolated. The first hole injection layers of all sub-pixels are communicated, the first electron injection layers of all sub-pixels are communicated, the second hole injection layers of all sub-pixels are communicated, the second electron injection layers of all sub-pixels are communicated, the third hole injection layers of all sub-pixels are communicated, the third electron injection layers of all sub-pixels are communicated, and the cathodes of all sub-pixels are communicated.

An embodiment of the present disclosure further provides a display substrate, which includes an organic light emitting device.

The organic light emitting device is the organic light emitting device according to any one of the foregoing embodiments, and the implementation principle and implementation effects are similar, which will not be repeated here.

An embodiment of the present disclosure also provides a display apparatus including a display substrate.

The display substrate is the display substrate according to any of the aforementioned embodiments, and has similar implementation principles and implementation effects, which will not be repeated here.

In an exemplary embodiment, the display device may be any product or component having a display function such as a mobile phone, a tablet computer, a television, a display, a notebook computer, a digital photo frame, a navigator, a vehicle-mounted display, a watch, and a wristband, etc.

The accompanying drawings of the present disclosure only involve the structures involved in the embodiments of the present disclosure, and other structures may refer to usual designs.

For the sake of clarity, in the accompanying drawings used for describing the embodiments of the present disclosure, a thickness and dimension of a layer or a micro structure is enlarged. It may be understood that when an element such as a layer, a film, a region, or a substrate is described as being "on" or "under" another element, the element may be "directly" located "on" or "under" the other element, or there may be an intermediate element.

Although the embodiments disclosed in the present disclosure are as above, the described contents are only embodiments used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. An organic light emitting device comprising an anode, an organic light emitting layer, a first transition protective layer and a cathode which are stacked sequentially; wherein
    the organic light emitting layer comprises a hole injection layer, a light emitting material layer, an electron transport layer and an electron injection layer; and
    the first transition protective layer is disposed between the electron injection layer and the cathode, and forms a PN junction with the electron injection layer;
    wherein the organic light emitting device comprises a second transition protective layer disposed between the first transition protective layer and the cathode; wherein
    the second transition protective layer and the first transition protective layer form a PN junction.

2. The organic light emitting device according to claim 1, wherein
    a fabrication material of the electron injection layer comprises an N-doping organic material, and a doping material of the electron injection layer comprises lithium fluoride or a complex of lithium and cesium carbonate; and
    a fabrication material of the first transition protective layer comprises a P-doping organic material, and a doping material of the first transition protective layer comprises molybdenum trioxide.

3. The organic light emitting device according to claim 1, wherein
    a fabrication material of the second transition protective layer comprises an N-doping organic material, and
    a doping material of the second transition protective layer comprises lithium fluoride or a complex of lithium and cesium carbonate.

4. The organic light emitting device according to claim 1, wherein the number of the electron injection layer is greater than or equal to one.

5. The organic light emitting device according to claim 4, wherein
    the organic light emitting layer further comprises a hole transport layer, and when the number of the electron injection layers is 1, the hole injection layer is located between the light emitting material layer and the anode, the hole transport layer is located between the hole injection layer and the light emitting material layer, and the electron transport layer is located between the light emitting material layer and the electron injection layer; and
    the fabrication material of the hole injection layer comprises a P-doping organic material, and a doping material of the hole injection layer comprises molybdenum trioxide.

6. The organic light emitting device according to claim 4, wherein
    the organic light emitting layer further comprises a hole transport layer, and when the number of the electron injection layers is 1, the electron injection layer and the electron transport layer are the same film layer;
    the hole injection layer is located between the light emitting material layer and the anode, and the hole transport layer is located between the hole injection layer and the light emitting material layer; the electron injection layer is located between the light emitting material layer and the first transition protective layer; and
    the fabrication material of the hole injection layer comprises a P-doping organic material, and a doping material of the hole injection layer comprises molybdenum trioxide.

7. The organic light emitting device of claim 5, wherein
    the organic light emitting layer further comprises a hole block layer and an electron block layer; and
    the hole block layer is located between the light emitting material layer and the electron transport layer, and the electron block layer is located between the light emitting material layer and the hole transport layer.

8. The organic light emitting device according to claim 7, wherein the anode is a transparent electrode and the cathode is a reflective electrode.

9. The organic light emitting device according to claim 4, wherein
    when the number of the electron injection layers is greater than 1, an ith electron injection layer is located on a side of the (i+1)th electron injection layer close to the anode; $1 \leq I \leq N-1$, N is the number of electron injection layers; and
    the transition protective layer and the Nth electron injection layer form a PN junction.

10. The organic light emitting device according to claim 9, wherein
    when N=3, the number of the hole injection layers is three, and the number of the light emitting material layers is four;
    a first light emitting material layer is located between a first hole injection layer and a first electron injection layer, the first hole injection layer is located on a side of the first light emitting material layer close to the anode, and the first electron injection layer is located on a side of the first light emitting material layer away from the anode;
    a second light emitting material layer and a third light emitting material layer are located between a second hole injection layer and a second electron injection layer, the third light emitting material layer is located on a side of the second light emitting material layer away from the anode, the second hole injection layer is located on a side of the second light emitting material layer close to the anode, and the second electron injection layer is located on a side of the third light emitting material layer away from the anode;
a fourth light emitting material layer is located between a third hole injection layer and a third electron injection layer, the third hole injection layer is located on a side of the fourth light emitting material layer close to the anode, and the third electron injection layer is located on a side of the fourth light emitting material layer far away from the anode;
the second hole injection layer is located between the first electron injection layer and the second light emitting material layer, and the third hole injection layer is located between the second electron injection layer and the fourth light emitting material layer;
a first transition protective layer is located between the third electron injection layer and the cathode; and
the third electron injection layer is multiplexed into an electron transport layer.

11. The organic light emitting device according to claim 10, wherein
a fabrication material of the first light emitting material layer is the same as that of the fourth light emitting material layer, and is a blue light emitting material; and
the second light emitting material layer is a red light emitting material, and the third light emitting material layer is a yellow light emitting material.

12. The organic light emitting device according to claim 11, wherein
a fabrication material of the three hole injection layers comprises a P-doping organic material, and
a doping material of the hole injection layer comprises molybdenum trioxide.

13. The organic light emitting device according to claim 12, wherein the anode and the cathode are both transparent electrodes.

14. A display substrate, comprising the organic light emitting device according to claim 1.

15. A display apparatus, comprising the display substrate according to claim 14.

16. The organic light emitting device of claim 6, wherein
the organic light emitting layer further comprises a hole block layer and an electron block layer; and
the hole block layer is located between the light emitting material layer and the electron transport layer, and the electron block layer is located between the light emitting material layer and the hole transport layer.

* * * * *